(12) United States Patent
Nagoshi et al.

(10) Patent No.: US 8,968,839 B2
(45) Date of Patent: Mar. 3, 2015

(54) METHOD FOR PRODUCING SURFACE-TREATED METALLIC MATERIAL

(75) Inventors: Masayasu Nagoshi, Chiba (JP); Kaoru Sato, Chiba (JP); Seiichi Watanabe, Hokkaido (JP); Souki Yoshida, Hokkaido (JP)

(73) Assignee: JFE Steel Corporation, Tokyo (JP)

( * ) Notice: Subject to any disclaimer, the term of this patent is extended or adjusted under 35 U.S.C. 154(b) by 0 days.

(21) Appl. No.: 13/988,848

(22) PCT Filed: Nov. 24, 2011

(86) PCT No.: PCT/JP2011/077735
§ 371 (c)(1),
(2), (4) Date: May 22, 2013

(87) PCT Pub. No.: WO2012/070687
PCT Pub. Date: May 31, 2012

(65) Prior Publication Data
US 2013/0243975 A1 Sep. 19, 2013

(30) Foreign Application Priority Data
Nov. 25, 2010 (JP) ................................ 2010-262208

(51) Int. Cl.
*H05H 1/24* (2006.01)
*C23C 16/44* (2006.01)
*C23C 26/00* (2006.01)

(52) U.S. Cl.
CPC ............. *C23C 16/4414* (2013.01); *C23C 26/00* (2013.01)
USPC ..................... 427/569; 427/248.1; 427/434.3; 204/164; 205/80; 205/93; 205/117; 205/118; 205/134

(58) Field of Classification Search
CPC ................ C23C 16/4414; C23C 16/50; C23C 22/00–22/86; C25D 5/00
USPC ........ 427/248.1, 569, 434.3; 205/134, 80, 93, 205/117, 118; 204/164
See application file for complete search history.

(56) References Cited

U.S. PATENT DOCUMENTS

| 7,166,206 B2 * | 1/2007 | Chen .............................. 205/316 |
| 2008/0210664 A1 | 9/2008 | Uenishi et al. |
| 2009/0078575 A1 * | 3/2009 | Mamaev et al. ................. 205/88 |
| 2009/0109141 A1 | 4/2009 | Murase et al. |

FOREIGN PATENT DOCUMENTS

JP 04-088196 3/1992
(Continued)

OTHER PUBLICATIONS

International Search Report, PCT/JP2011/077735, Jan. 31, 2012.

*Primary Examiner* — Elizabeth Burkhart
(74) *Attorney, Agent, or Firm* — Young & Thompson

(57) ABSTRACT

There is provided a method for producing a surface-treated metallic material, by use of which a metallic material having a stable and excellent sliding characteristic can be produced with a low environmental load without covering the metallic material surface with an oxide film. The method for producing a surface-treated metallic material includes immersing an anode and a cathode in an electrolyte solution, placing a metallic material used as a material to be treated above the surface of the electrolyte solution, and applying a voltage between the anode and the cathode to treat the metallic material surface, the voltage being equal to or higher than a voltage for causing a complete plasma state.

16 Claims, 4 Drawing Sheets

(56) References Cited

FOREIGN PATENT DOCUMENTS

| | | |
|---|---|---|
| JP | 05-285212 | 11/1993 |
| JP | 2008-238268 | 10/2008 |
| JP | 2010-084231 | 4/2010 |
| WO | 02/38827 | 5/2002 |
| WO | WO 2006/059808 | 6/2006 |
| WO | WO 2006/104043 | 10/2006 |

* cited by examiner (a)

(b)

METHOD FOR PRODUCING SURFACE-TREATED METALLIC MATERIAL

TECHNICAL FIELD

The present invention relates to a method for producing a surface-treated metallic material and more particularly to a method for producing a surface-treated metallic material having an excellent sliding characteristic.

BACKGROUND ART

In recent years, various functions have been required for metallic materials, such as steel materials and alloy materials. More specifically, for example, there is a demand for metallic materials having high processability that can be subjected to complicated processing to manufacture elaborately designed products in the field of metallic materials for use in the manufacture of automotive parts and household electrical appliances.

In general, the processability of a metallic material is greatly affected by the elongation, the work-hardening exponent (n value), and the Lankford value (r-value) of the metallic material. In addition to these factors, the sliding characteristic of a surface of the metallic material also greatly affects the processability of the metallic material. More specifically, a metallic material having a lower surface friction coefficient and a better sliding characteristic has higher processability, and a metallic material having a higher surface friction coefficient and a poorer sliding characteristic has lower processability.

Thus, in order to provide a metallic material having high processability, various methods for surface-treating a metallic material to improve the sliding characteristic of the metallic material surface have been proposed. More specifically, some proposed methods for surface-treating a metallic material to improve the sliding characteristic of the metallic material surface include a method for providing a surface of a high-tensile cold-rolled steel sheet with predetermined roughness using a work roll (see, for example, Patent Literature 1) and a method for forming a predetermined phosphorous oxide film on a surface of a galvanized steel sheet (see, for example, Patent Literature 2).

CITATION LIST

Patent Literature

PTL 1: Japanese Unexamined Patent Application Publication No. 2008-238268
PTL 2: Japanese Unexamined Patent Application Publication No. 4-88196

SUMMARY OF INVENTION

Technical Problem

However, the surface treatment method using a work roll described in Patent Literature 1 has a problem that the surface treatment of a metallic material wears the work roll and the roughness of the metallic material surface changes over time. Thus, it is difficult for the metallic material to stably have a desired sliding characteristic. The surface treatment method for forming a phosphorous oxide film described in Patent Literature 2 has a problem that the metallic material surface covered with the oxide film has adverse effects on secondary treatment, such as chemical conversion treatment, and phosphorus has a high environmental load.

Accordingly, it is an object of the present invention to provide a method for producing a surface-treated metallic material, by use of which a metallic material having a stable and excellent sliding characteristic can be produced with a low environmental load without covering the metallic material surface with an oxide film.

Solution to Problem

The present inventors performed extensive studies in order to impart a stable and excellent sliding characteristic to a metallic material without forming an oxide film on the surface of the metallic material. As a result, the present inventors completed the present invention by finding that a stable and excellent sliding characteristic can be imparted to a metallic material (a material to be treated) by placing the metallic material above the surface of an electrolyte solution while a predetermined voltage is applied between a cathode and an anode in the electrolyte solution to induce plasma discharge in the electrolyte solution, thereby forming fine roughness on the metallic material surface.

The present invention aims to advantageously solve the problems described above. A method for producing a surface-treated metallic material according to the present invention includes immersing an anode and a cathode in an electrolyte solution, placing a metallic material used as a material to be treated above the surface of the electrolyte solution, and applying a voltage between the anode and the cathode to treat the metallic material surface, the voltage being equal to or higher than a voltage for causing a complete plasma state.

The term "above the surface of the electrolyte solution", as used herein, refers to above the surface of the electrolyte solution before a voltage is applied between the anode and the cathode. The "metallic material used as a material to be treated" may be a metallic cathode itself (that is, a single member including the cathode) extending above the surface of the electrolyte solution or may be separated from the cathode. The term "complete plasma state", as used herein, refers to a state in which the cathode surface is covered with light emission including an orange color or light emission mainly composed of an orange color during discharge. When the cathode is made of a material that is to be oxidized at high temperature in the atmosphere, such as stainless steel or a steel material containing carbon steel or alloy steel, the term "voltage for causing a complete plasma state", as used herein, means that application of such a voltage for 30 minutes causes the oxidation of a portion having a thickness of at least μm in a surface layer of the cathode immersed in the electrolyte solution. The thickness of the oxidized portion in the surface layer of the cathode can be measured as the average thickness of the oxidized layer through a scanning electron microscope (SEM) observation of a cross section of the cathode. The oxidized layer can be clearly distinguished from its underlayer in a SEM backscattered electron image. The average thickness of the oxidized layer can be determined by averaging the thicknesses of the oxidized layer in a cross section having a length of 10 μm parallel to the cathode surface. When the cathode surface layer has an empty void, the oxidation thickness takes the empty space into account.

In accordance with a method for producing a surface-treated metallic material according to the present invention, the metallic material is preferably electrically connected to the cathode.

In accordance with a method for producing a surface-treated metallic material according to the present invention, the metallic material is preferably separated from the cathode.

In accordance with a method for producing a surface-treated metallic material according to the present invention, a voltage of 100 volts or more and 300 volts or less is preferably applied between the anode and the cathode.

In accordance with a method for producing a surface-treated metallic material according to the present invention, the distance between the surface of the electrolyte solution and the metallic material is preferably 2 mm or more and 30 mm or less.

In accordance with a method for producing a surface-treated metallic material according to the present invention, the metallic material is preferably a cold-rolled steel sheet.

Advantageous Effects of Invention

In accordance with a method for producing a surface-treated metallic material according to the present invention, the surface of the metallic material used as a material to be treated placed above the surface of the electrolyte solution can be treated to produce a metallic material having a stable and excellent sliding characteristic with a low environmental load without covering the metallic material surface with an oxide film.

BRIEF DESCRIPTION OF DRAWINGS

FIG. 1(a) illustrates the case where a metallic material used as a material to be treated is a member including a cathode. FIG. 1(b) illustrates the case where a metallic material used as a material to be treated is separated from a cathode.

DESCRIPTION OF EMBODIMENTS

Embodiments of the present invention will be described in detail below with reference to the drawings. A method for producing a surface-treated metallic material according to the present invention includes immersing an anode and a cathode in an electrolyte solution, placing a metallic material used as a material to be treated above the surface of the electrolyte solution, and applying a predetermined voltage between the anode and the cathode to form a fine structure on a surface of the metallic material used as a material to be treated, thereby producing a surface-treated metallic material having a stable and excellent sliding characteristic.

Figure 1:
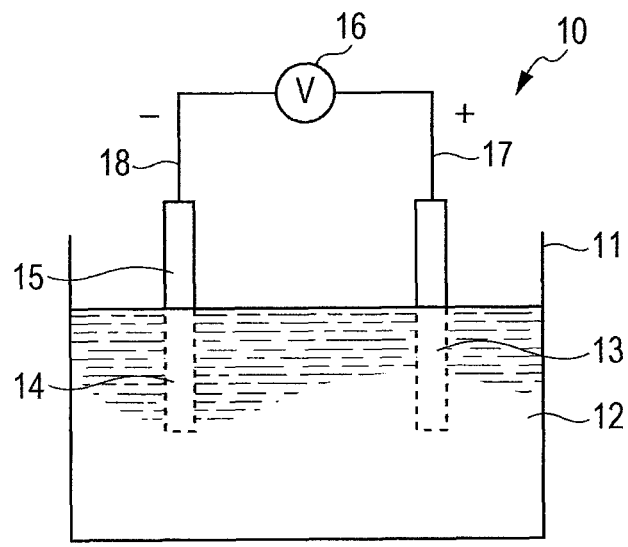
FIG. 1 is an explanatory view of a surface treatment apparatus that can be used in the production of a surface-treated metallic material using a typical method for producing a surface-treated metallic material according to the present invention.
Figure 1:
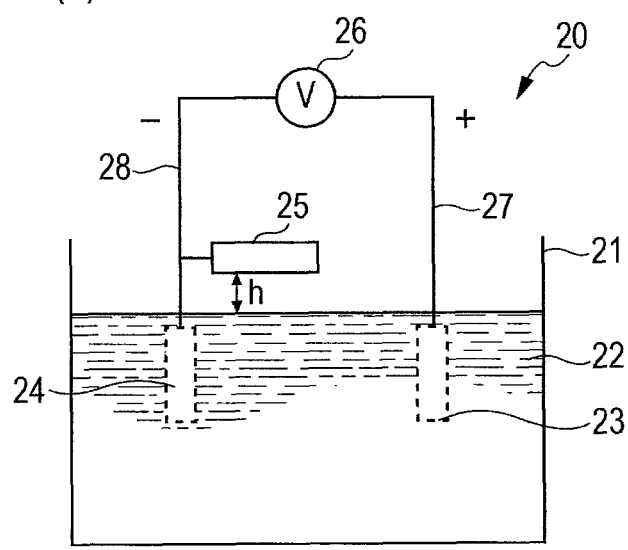

A method for producing a surface-treated metallic material according to an embodiment of the present invention is not particularly limited and may employ a surface treatment apparatus 10 as illustrated in FIG. 1(a). In FIG. 1(a), a portion of electrode and work piece immersed in a solution is indicated by a broken line.

The surface treatment apparatus 10 illustrated in FIG. 1(a) includes a surface treatment bath 11, an electrolyte solution 12 in the surface treatment bath 11, an anode 13 and a cathode 14 immersed in the electrolyte solution 12, the anode 13 and the cathode 14 being separated from each other, and a direct-current power source 16 electrically connected to the anode 13 and the cathode 14 through lead wires 17 and 18. The cathode 14 is made of a metallic material. The metallic material extends above the surface of the electrolyte solution 12. A portion of the metallic material of the cathode 14 above the surface of the electrolyte solution 12 is a material to be treated 15 in the production method according to the present embodiment. In the surface treatment apparatus 10, the cathode 14 and the material to be treated 15 are combined into a single body.

The surface treatment bath 11 may be a known surface treatment bath made of a material stable in the electrolyte solution 12, for example, a surface treatment bath made of glass, Teflon (registered trademark), or polyethyl ether ketone (PEEK).

The electrolyte solution 12 may be any electroconductive liquid in which the application of a voltage between the anode 13 and the cathode 14 to treat the surface of the material to be treated 15 produces negligible deposit, precipitate, or sediment on the surfaces of the anode 13 and the cathode 14. Specific examples of the electrolyte solution 12 include, but are not limited to, aqueous solutions containing at least one selected from the group consisting of potassium carbonate ($K_2CO_3$), sodium carbonate ($Na_2CO_3$), sodium hydrogen carbonate ($NaHCO_3$), ammonium carbonate (($NH_4)_2CO_3$), lithium hydroxide (LiOH), sodium hydroxide (NaOH), magnesium hydroxide ($Mg(OH)_2$), potassium hydroxide (KOH), ammonium hydroxide ($NH_4OH$), sodium chloride (NaCl), potassium chloride (KCl), magnesium chloride ($MgCl_2$), ammonium chloride ($NH_4Cl$), sulfates of lithium, sulfates of sodium, sulfates of magnesium, sulfates of potassium, sulfates of ammonium, nitrates of lithium, nitrates of sodium, nitrates of magnesium, nitrates of potassium, nitrates of ammonium, citrates of lithium, citrates of sodium, such as sodium citrate ($NaH_2(C_3H_5O(COO)_3)$), citrates of magnesium, citrates of potassium, citrates of ammonium, sulfuric acid, nitric acid, hydrochloric acid, and citric acid.

The electrolyte solution 12 may have any pH and concentration, provided that the surface treatment of a metallic material used as the material to be treated 15 can be performed. For example, when an aqueous potassium carbonate solution is used as the electrolyte solution 12, its concentration is not particularly limited, for example, 0.001 mol/liter or more, preferably 0.005 mol/liter or more. At an excessively low concentration, it may be difficult to maintain a suitable discharge state while a voltage is applied between the anode 13 and the cathode 14. The upper limit of the concentration is not particularly limited but may be 0.5 mol/liter or less. The electrolyte solution 12 may have any pH, provided that the electrodes are not excessively corroded or etched, and may have a pH in the range of 5 to 12.

As described in detail below, in accordance with a production method according to the present invention, it is supposed that droplets, vapor, or both of them of the electrolyte solution reach the surface of the material to be treated and form a fine structure on the surface of the material to be treated, and the fine structure improves the sliding characteristic of the metallic material used as the material to be treated.

The anode 13 may be a platinum (Pt) electrode, a palladium (Pd) electrode, an iridium (Ir) electrode, or their alloys, an electrode coated with Pt, Pd, Ir, or their alloys, or a graphite electrode, for examples. In the surface treatment apparatus 10, in the same manner as in the metallic material of the cathode 14, the electrode material of the anode 13 also extends above the surface of the electrolyte solution 12. In accordance with a production method according to the present invention, a surface treatment apparatus may be used in which an anode is completely immersed in an electrolyte solution.

The cathode 14 and the material to be treated 15 are formed as a single metallic material. The cathode 14 is a portion of the metallic material immersed in the electrolyte solution 12, and the material to be treated 15 is a non-immersed portion of the metallic material above the surface of the electrolyte solution 12. Thus, in the surface treatment apparatus 10, since the cathode 14 and the material to be treated 15 are formed as a single metallic material, the cathode 14 is electrically connected (conductively connected) to the material to be treated 15. In a production method according to the present invention, the cathode and the material to be treated made of different materials may be combined into a single body.

The metallic material of the cathode 14 and the material to be treated 15 may be a cold-rolled steel sheet, such as a cold-rolled stainless steel sheet, a cold-rolled carbon steel sheet, or a high-strength cold-rolled steel sheet, a hot-rolled steel sheet, such as a high-strength hot-rolled steel sheet or a thick hot-rolled steel sheet, or a noble metal material, such as Au. The shape of the metallic material of the cathode 14 and the material to be treated 15 is not particularly limited and may be plate-like, wire-like, or rectangular. The surface of the non-immersed portion (the material to be treated 15) of the metallic material may be subjected to mirror polishing using sandpaper.

The direct-current power source 16 is electrically connected to the anode 13 through the lead wire 17 and to the metallic material (the cathode 14 and the material to be treated 15) through the lead wire 18. The direct-current power source 16 applies a voltage necessary for the surface treatment of the material to be treated 15, for example, a voltage of 100 V or more and 300 V or less, between the anode 13 and the cathode 14. The direct-current power source 16 may be a known power source.

With the surface treatment apparatus 10 having the structure as described above, a surface-treated metallic material may be produced by a method for producing a surface-treated metallic material according to an embodiment of the present invention as described below.

First, the anode 13 and the cathode 14, which is part of the metallic material, are separately immersed in the electrolyte solution 12 in the surface treatment bath 11 to construct a system (surface treatment system) for the surface treatment of the material to be treated 15, which is part of the metallic material above the surface of the electrolyte solution 12.

A voltage V equal to or higher than a predetermined voltage $V_1$ ($0 < V_1 \leq V$) is then applied between the anode 13 and the cathode 14 to cause plasma discharge in the electrolyte solution 12, thereby treating the surface of the material to be treated 15, which is part of the metallic material above the surface of the electrolyte solution 12 (a surface treatment process).

The predetermined voltage $V_1$ is a voltage for causing a complete plasma state of the surface treatment system. When the cathode is made of a material that is to be oxidized at high temperature in the atmosphere, such as stainless steel or a steel material containing carbon steel or alloy steel, the term "voltage for causing a complete plasma state", as used herein, means that application of such a voltage for 30 minutes causes the oxidation of a portion having a thickness of at least 1 μm in a surface layer of the cathode immersed in the electrolyte solution. More specifically, the voltage $V_1$ for causing a complete plasma state of the surface treatment system may be determined by applying a voltage to the surface treatment system for 30 minutes in increments of 5 or 10 volts and experimentally determining the voltage at which the area percentage of an oxidized region having a thickness of at least 1 μm in the surface layer at the tip of the cathode (the portion immersed in the electrolyte solution) (=(the area of the oxidized region having a thickness of at least 1 μm/the area of the immersed portion) ×100 (unit: %)) is 50% or more.

The voltage $V_1$ for causing a complete plasma state depends on the surface treatment system. In general, the voltage $V_1$ for causing a complete plasma state is often 100 V or more. More specifically, the voltage $V_1$ is 115 volts when the material to be treated 15 is SUS316L and is 117 volts when the material to be treated 15 is a cold-rolled steel sheet. Thus, in order to apply a voltage equal to or higher than the voltage $V_1$ for causing a complete plasma state to properly treat the surface of the material to be treated 15, the voltage applied between the anode 13 and the cathode 14 is preferably 100 volts or more, more preferably 110 volts or more. In order to prevent the fusion of the cathode 14, the voltage applied between the anode 13 and the cathode 14 is preferably 300 volts or less.

Figure 2:
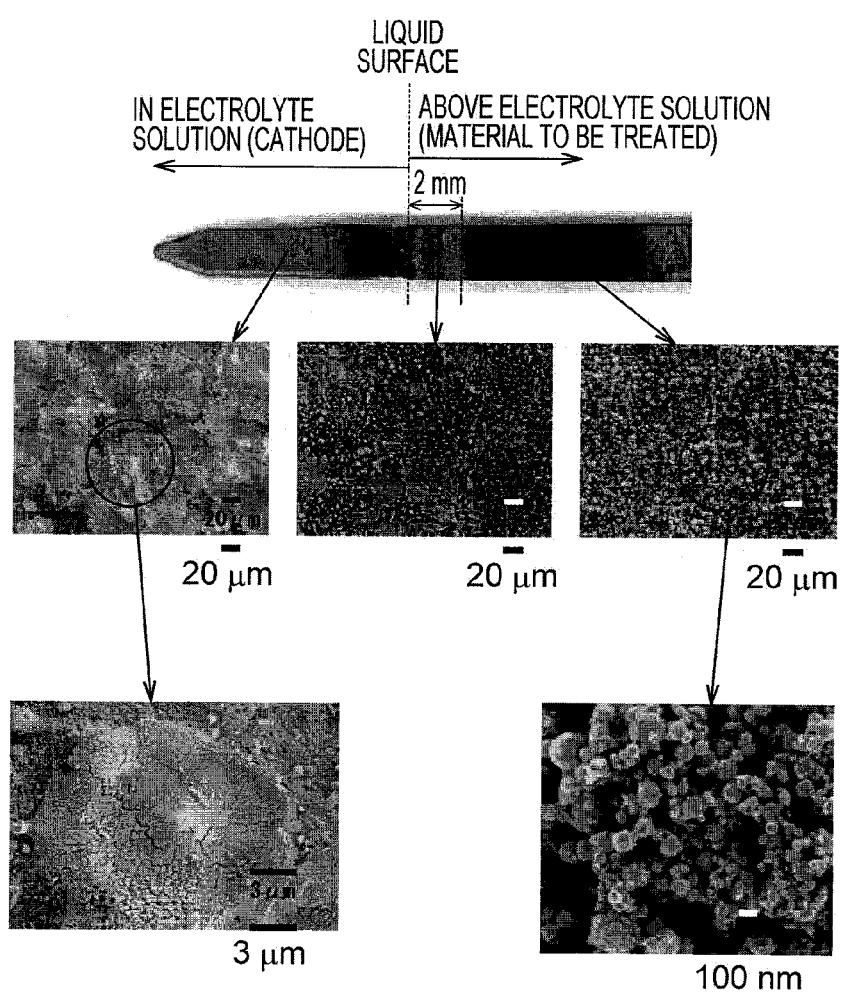
FIG. 2 includes a photograph of a surface-treated cold-rolled steel sheet and a cathode produced by a production method according to the present invention using the surface treatment apparatus illustrated in FIG. 1(a) and enlarged scanning electron microscope (SEM) photographs (secondary electron images) of the surface of portions of the surface-treated cold-rolled steel sheet and the cathode.

When a voltage V equal to or higher than the voltage $V_1$ for causing a complete plasma state is applied between the anode 13 and the cathode 14, a fine structure, for example, as shown in FIG. 2 is formed on the surface of the material to be treated 15, which a portion of the metallic material above the surface of the electrolyte solution 12, and improves the sliding characteristic of the metallic material. More specifically, as shown in the SEM photographs of the surface in the middle of FIG. 2, fine roughness having a size of a few micrometers as viewed from the top are formed, for example, in a portion less than 2 mm above the surface of the electrolyte solution 12, and stably improve the sliding characteristic. For example, in a portion 2 mm or more and 30 mm or less above the surface of the electrolyte solution 12, as shown in the SEM photograph of the surface on the right side in FIG. 2 and the SEM photograph of a cross section of the surface layer in FIG. 3, a particular structure containing fine particles having a diameter of less than 1 μm (nano-level) is formed in a gap of fine roughness and further stably improves the sliding characteristic. Although the reason for the stable improvement in the sliding characteristic is not clear, it is supposed that the improvement results from load distribution due to the fine roughness and prevention of adhesion due to the movement or oxidation of the fine particles.

The surface of the cathode 14 immersed in the electrolyte solution 12 is oxidized by the application of a voltage V equal to or higher than the voltage $V_1$ for causing a complete plasma state and has a crater as shown on the left side in FIG. 2.

Although the mechanisms for the formation of the fine roughness on the surface of the material to be treated 15 and the formation of the fine particles of the order of nanometers are not theoretically clear, it may be supposed as described below. When a voltage V equal to or higher than the voltage $V_1$ for causing a complete plasma state is applied between the anode 13 and the cathode 14 to cause plasma discharge in the electrolyte solution 12, droplets, vapor, or both of them of the electrolyte solution 12 probably come into contact with the material to be treated 15 to form fine roughness on the surface. Furthermore, fine particles of the order of nanometers formed by the fusion of part of the cathode 14 during discharge in the electrolyte solution 12 are probably swirled up by droplets, vapor (bubbles), or both of them of the electrolyte solution 12 and adhere to the surface, forming fine particles of the order of nanometers. Thus, in accordance with a method for producing a surface-treated metallic material according to the present invention, a material to be treated must be placed above the surface of the electrolyte solution, and a voltage V equal to or higher than the voltage $V_1$ must be applied between the anode and the cathode.

Plasma discharge in the electrolyte solution 12 is probably caused when the application of a voltage locally increases the temperature of the electrolyte solution 12 in the vicinity of the cathode 14 above the boiling point, generates a gas phase in the vicinity of the cathode 14, and causes plasma discharge in the gas phase. As described above, in a method for producing a surface-treated metallic material according to the present invention, it is supposed that droplets, vapor, or both of them of the electrolyte solution 12 come into contact with the surface of the material to be treated 15 to form a fine structure on the surface of the material to be treated 15, thereby stably improving the sliding characteristic of the metallic material used as the material to be treated. Thus, the application of a voltage between the anode 13 and the cathode 14 in the surface treatment process is preferably performed after the temperature of the electrolyte solution 12 is increased to a temperature in the range of 90° C. to 100° C. with heating means (not shown), such as a heater. This is because plasma discharge in the electrolyte solution 12 can be efficiently caused by efficiently increasing the temperature in the vicinity of the cathode 14. This is also because droplets and vapor of the electrolyte solution 12 can be efficiently produced. The voltage application time in the surface treatment process may be, but is not limited to, 5 seconds or more and 60 minutes or less.

In accordance with the method for producing a surface-treated metallic material according to the present embodiment, only the application of a predetermined voltage between the anode and the cathode can form fine roughness and fine particles of the order of nanometers on the surface of the metallic material used as the material to be treated, thereby stably improving the sliding characteristic of the metallic material. Thus, a metallic material having a stable and excellent sliding characteristic can be produced with a low environmental load without covering the metallic material surface with an oxide film (except a natural oxidation film).

A method for producing a surface-treated metallic material according to an embodiment of the present invention may be performed with an apparatus other than the surface treatment apparatus 10, for example, a surface treatment apparatus 20 illustrated in FIG. 1(b). In FIG. 1(b), a portion immersed in a solution is indicated by a broken line.

The surface treatment apparatus 20 illustrated in FIG. 1(b) includes a surface treatment bath 21, an electrolyte solution 22 in the surface treatment bath 21, an anode 23 and a cathode 24 immersed in the electrolyte solution 22, the anode 23 and the cathode 24 being separated from each other, and a direct-current power source 26 electrically connected to the anode 23 and the cathode 24 through lead wires 27 and 28. The anode 23 and the cathode 24 of the surface treatment apparatus 20 are entirely immersed in the electrolyte solution 22. In accordance with a production method according to the present invention, the anode 23 and the cathode 24 may be partly immersed in the electrolyte solution. When a cathode made of a metallic material is partly immersed in the electrolyte solution, a portion of the cathode above the surface of the electrolyte solution is also the material to be treated.

In the surface treatment apparatus 20, a material to be treated 25 made of a metallic material is placed above the surface of the electrolyte solution 22 at a distance h from the surface in the absence of a voltage between the anode 23 and the cathode 24. The cathode 24 is electrically connected to the material to be treated 25 through the lead wire 28. In the surface treatment apparatus 20, the cathode 24 is separated from the material to be treated 25.

The surface treatment bath 21, the electrolyte solution 22, the anode 23, the direct-current power source 26, and the lead wires 27 and 28 in the surface treatment apparatus 20 may be the same as the surface treatment bath 11, the electrolyte solution 12, the anode 13, the direct-current power source 16, and the lead wires 17 and 18 in the surface treatment apparatus 10.

The cathode 24 is made of an electroconductive electrode material. The electrode material of the cathode 24 may be the same as or different from the material to be treated 25. More specifically, the cathode 24 may be made of a cold-rolled steel sheet, such as a cold-rolled stainless steel sheet or a cold-rolled carbon steel sheet, a hot-rolled steel sheet, or a metal or alloy containing a noble metal.

The material to be treated 25 is fixed at the distance h from the surface of the electrolyte solution 22 with a known fixing device (not shown). The material to be treated 25 is connected to the lead wire 28, which connects the cathode 24 to the direct-current power source 26. Thus, the cathode 24 is electrically connected to the material to be treated 25 through the lead wire 28. In the surface treatment apparatus 20, the surface of the material to be treated 25 facing the electrolyte solution 22 is treated to have a stably improved sliding characteristic. The material to be treated 25 may be a cold-rolled steel sheet, such as a cold-rolled stainless steel sheet, a cold-rolled carbon steel sheet, or a high-strength cold-rolled steel sheet, a hot-rolled steel sheet, such as a high-strength hot-rolled steel sheet or a thick hot-rolled steel sheet, or a noble metal material, such as gold (Au). The material to be treated 25 may be connected to the lead wire 28 with screws or by welding.

The distance h from the surface of the electrolyte solution 22 to the material to be treated 25 is preferably, but not limited to, 2 mm or more and 30 mm or less (2 mm≤h≤30 mm). When the distance h is 2 mm or more and 30 mm or less, the surface of the material to be treated 25 facing the electrolyte solution 22 can be satisfactorily treated to yield a metallic material having a stable and excellent sliding characteristic.

The material to be treated 25 may be placed at any position and is preferably placed above the position of discharge occurring in the electrolyte solution 22. For example, the material to be treated 25 may be placed above the electrolyte solution 22 in the vicinity of the cathode 24 or above the electrolyte solution 22 between the anode 23 and the cathode 24. This is because droplets and vapor can easily come into contact with the material to be treated, which allows stable treatment.

In the surface treatment apparatus 20, in order to more satisfactorily treat the surface of the material to be treated 25, the cathode 24 is electrically connected to the material to be treated 25 through the lead wire 28. However, in accordance with a method for producing a surface-treated metallic material according to the present invention, when droplets, vapor, or both of them of the electrolyte solution come into contact with the material to be treated during plasma discharge in the electrolyte solution, the cathode is not necessarily electrically connected to the material to be treated. Although it is not clear why electrical connection between the cathode 24 and the material to be treated 25 can further improve the treatment of the surface of the material to be treated 25, this is probably because the passage of electric current between the material to be treated and the anode through droplets and vapor of the electrolyte solution promotes the formation of fine roughness on the surface of the material to be treated.

With the surface treatment apparatus 20 having the structure as described above, in the same manner as the surface treatment apparatus 10, a surface-treated metallic material may be produced by a method for producing a surface-treated metallic material according to an embodiment of the present invention as described below.

More specifically, first, the anode 23 and the cathode 24 are separately immersed in the electrolyte solution 22 in the surface treatment bath 21. The material to be treated 25 is then placed above the surface of the electrolyte solution 22 at the distance h from the surface. The material to be treated 25 is electrically connected to the cathode 24 through the lead wire 28 to construct a system (surface treatment system) for the surface treatment of the material to be treated 25, which is the metallic material above the surface of the electrolyte solution 22.

A voltage V equal to or higher than a voltage $V_1$ for causing a complete plasma state ($0<V_1 \leq V$) is then applied between the anode 23 and the cathode 24 to cause plasma discharge in the electrolyte solution 22, thereby treating the surface of the material to be treated 25, which is the metallic material above the surface of the electrolyte solution 22 (a surface treatment process). The voltage $V_1$ for causing a complete plasma state can be determined in the same manner as in the production of a surface-treated metallic material using the surface treatment apparatus 10. The voltage applied between the anode 23 and the cathode 24 may be the same as the voltage in the production of a surface-treated metallic material using the surface treatment apparatus 10.

In the same manner as in the surface treatment apparatus 10, the application of a voltage V equal to or higher than the voltage $V_1$ between the anode 23 and the cathode 24 in the surface treatment apparatus 20 can form a fine structure on the surface (the surface facing the electrolyte solution 22) of the material to be treated 25 made of the metallic material, thereby stably improving the sliding characteristic of the metallic material. In the surface treatment apparatus 20, the cathode 24 is separated from the material to be treated 25, and the distance h from the electrolyte solution 22 to the material to be treated 25 is maintained constant. Thus, the surface of the material to be treated 25 can be more uniformly treated. Since the cathode 24 is separated from the material to be treated 25 in the surface treatment apparatus 20, only the material to be treated 25 can be easily replaced, and surfaces of materials to be treated having various shapes may be treated.

A method for producing a surface-treated metallic material according to the present invention is not limited to these embodiments. A method for producing a surface-treated metallic material according to the present invention may be appropriately modified.

Although the present invention will be described in detail in the following Examples 1 and 2,, the present invention is not limited to Examples 1 and 2.

EXAMPLE 1

Test Examples 1 to 4

A surface of a material to be treated was treated with the surface treatment apparatus illustrated in FIG. 1(a) while the voltage applied between the anode and the cathode was changed as shown in Table 1.

More specifically, a strip of cold-rolled steel sheet (containing 0.018% by mass C, 0.010% by mass Si, and 0.140% by mass Mn) having a thickness of 0.8 mm, a width of 3 mm, and a length of 70 mm was used as the metallic material including both the material to be treated and the cathode. The anode was a mesh of platinum (Pt) electrode (Pt wires having a diameter of 0.5 mm and a length of approximately 640 mm were separately arranged in a zigzag in a region 40 mm in length and 100 mm in width). The electrolyte solution was a 0.1 mol/liter aqueous potassium carbonate ($K_2CO_3$) solution heated to 95° C. in advance. While portions (having a length of 12 mm) of the metallic material and the anode were immersed in the electrolyte solution, a voltage in the range of 90 to 120 volts was applied between the anode and the cathode (metallic material) for 60 minutes to produce surface-treated metallic materials, which were used as samples (test examples 2 to 4). An untreated metallic material (a cold-rolled steel sheet) was used as a sample for comparison (a test example 1).

The surface state and the sliding characteristic of each sample were evaluated by the following method. Table 1 shows the results.

The voltage $V_1$ for causing a complete plasma state was found to be 117 volts in a surface treatment system including a cold-rolled steel sheet as the cathode, a mesh of Pt electrode as the anode, and a 0.1 mol/liter aqueous $K_2CO_3$ solution as the electrolyte solution.

<Evaluation of Surface State>

The surface state of each sample at a distance h from the surface of the electrolyte solution was observed with a low voltage SEM (accelerating voltage: 1 kilovolts) to check for fine roughness on the surface. The composition of the surface layer of each sample was determined with an energy dispersive X-ray spectrometer (EDS) attached to the SEM. The surface layer from the top surface of the sample to a depth of 1 μm was checked for oxidation.

<Evaluation of Sliding Characteristic>

The friction coefficient of the surface of each sample (a central portion of the sample in the width direction at a distance h from the surface of the electrolyte solution) was measured with a nanotribometer manufactured by CSM Instruments SA.

More specifically, a metal ball (made of SUJ2) having a diameter of 1.5 mm was pressed against the surface of the sample at a load of 5 nN and was moved at 5 mm/sec. along the circumference of a circle having a diameter of 0.5 mm. The metal ball slid 9 m in total on the sample. The friction coefficient was determined as the ratio of drawing load to pressing load. The mean value and standard deviation (the friction coefficient oscillation σ) of the friction coefficient were recorded while the metal ball slid 9 m. A sample having a lower average friction coefficient and a lower friction coefficient oscillation has a more stable and better sliding characteristic.

TABLE 1

| Test No. | Applied voltage [volt] | Distance h from liquid surface [mm]*1 | Formation of roughness | Formation of fine particles | Presence of oxidized surface layer | Average friction coefficient [—] | Friction coefficient oscillation σ [—] | Note |
|---|---|---|---|---|---|---|---|---|
| 1 | — | — | — | — | No | 0.77 | 0.06 | Comparative example |
| 2 | 90 | 3 | No | No | No | 0.81 | 0.05 | Comparative example |
| 3 | 110 | 3 | No | No | No | 0.76 | 0.07 | Comparative example |
| 4 | 120 | 3 | Yes | Yes | No | 0.57 | 0.03 | Example |

*1 The distance in an upward direction from the liquid surface is positive.

Among the test examples 1 to 3 and the test example 4 the test example 4, which involved the application of a voltage $V_1$ equal to or higher than the voltage $V_1$ for causing a complete plasma state, had fine roughness on the surface of the metallic material used as the material to be treated and a low average friction coefficient and a low friction coefficient oscillation, thus providing a metallic material having a satisfactory and stable sliding characteristic. The material to be treated according to the test example 4 had no oxide layer having a thickness of 1 μm or more. In contrast, the test examples 1 to 3, which involved the application of a voltage lower than the voltage $V_1$ for causing a complete plasma state, had no fine roughness on the metallic material surface and a high average friction coefficient and a high friction coefficient oscillation, thus providing a metallic material having an inferior sliding characteristic.

EXAMPLE 2

Test Examples 5 to 11

A voltage of 125 volts was applied for 60 minutes between the anode and the cathode in the surface treatment apparatus illustrated in FIG. 1(a) to produce a surface-treated metallic material, which was used as a sample. The metallic material including both the material to be treated and the cathode, the anode, and the electrolyte solution were the same as in the test examples 2 to 4.

Figure 3:
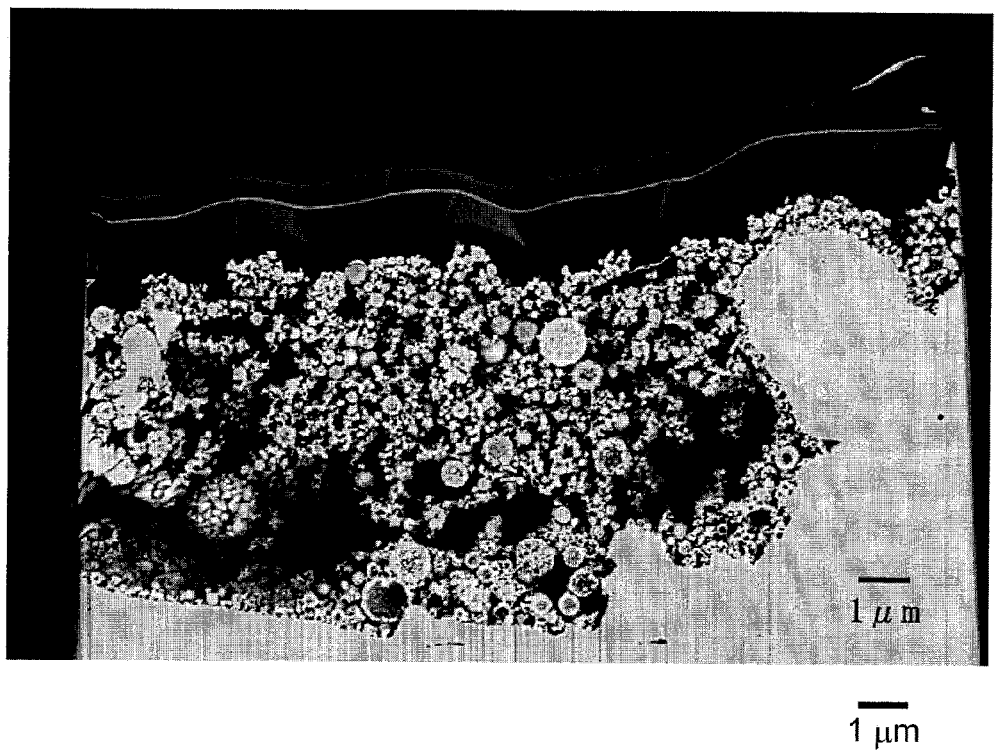
FIG. 3 is a SEM photograph (backscattered electron image) showing the cross-sectional morphology of a surface layer of a surface-treated cold-rolled steel sheet produced by a production method according to the present invention.
Figure 4:
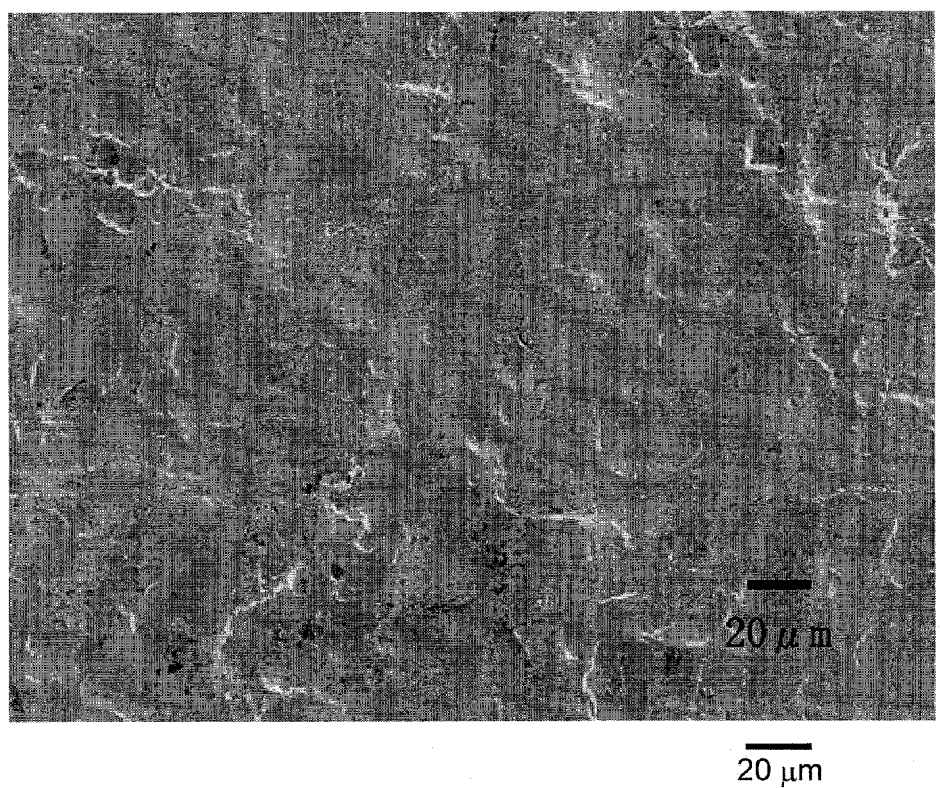
FIG. 4 is a SEM photograph (secondary electron image) showing the surface state of an untreated cold-rolled steel sheet, which is not subjected to surface treatment using the surface treatment apparatus illustrated in FIG. 1(a).

The sliding characteristic and other characteristics of the sample at different positions were evaluated in the same manner as in the test examples 1 to 4. Table 2 shows the results. FIG. 2 shows a photograph of the entire sample and SEM photographs of the surface of the sample at different positions. FIG. 3 shows a SEM photograph (backscattered electron image) of a cross section of a surface layer of the sample at a position 5 mm above the surface of the electrolyte solution (test example 7). FIG. 4 shows the surface of the material to be treated before treatment (corresponding to the untreated cold-rolled steel sheet in the test example 1).

TABLE 2

| Test No. | Applied voltage [volt] | Distance h from liquid surface [mm]*1 | Formation of roughness | Formation of fine particles | Presence of oxidized surface layer | Average friction coefficient [—] | Friction coefficient oscillation σ [—] | Note |
|---|---|---|---|---|---|---|---|---|
| 5 | 125 | 1 | Yes | No | No | 0.62 | 0.03 | Example |
| 6 | 125 | 2.5 | Yes | Yes | No | 0.54 | 0.02 | Example |
| 7 | 125 | 5 | Yes | Yes | No | 0.51 | 0.02 | Example |
| 8 | 125 | 10 | Yes | Yes | No | 0.53 | 0.02 | Example |
| 9 | 125 | 15 | Yes | Yes | No | 0.50 | 0.03 | Example |
| 10 | 125 | 30 | Yes (slight) | Yes | No | 0.66 | 0.04 | Example |
| 11 | 125 | −5 | No | Yes (trace) | Yes | 0.54 | 0.07 | Comparative example |

*1 The distance in an upward direction from the liquid surface is positive.

The test examples 5 to 10 and the test example 11 had fine roughness on the surface of the material to be treated placed above the surface of the electrolyte solution and a low average friction coefficient and a low friction coefficient oscillation, thus providing a metallic material having a better and more stable sliding characteristic than the untreated cold-rolled steel sheet (test example 1). The test example 5 and the test examples 6 to 10 show that when the distance from the surface of the electrolyte solution to the material to be treated was 2 mm or more, a particular structure containing fine particles having a diameter of less than 1 μm (nano-level) was formed in a gap of fine roughness (see FIGS. 2 and 3) and further stably improved the sliding characteristic. The test example 11 had a crater on the surface of the cathode immersed in the electrolyte solution and had a low average friction coefficient but a high friction coefficient oscillation. Thus, the test example 11 could not stably have a satisfactory sliding characteristic. Unlike the material to be treated in the test examples 5 to 10, the test example 11 had an oxide layer having a thickness of 1 μm or more on the cathode surface.

Referring to FIG. 3, it is supposed that the fine roughness's are formed of the metallic material used as the material to be treated. An analysis of the fine particles formed in the test examples 6 to 10 with a transmission electron microscope (TEM) showed that the fine particles were composed of a mixture of a metal and an oxide.

[Industrial Applicability]

In accordance with a method for producing a surface-treated metallic material according to the present invention, the surface of the metallic material used as a material to be treated placed above the surface of the electrolyte solution can be treated to produce a metallic material having a stable and excellent sliding characteristic with a low environmental load without covering the metallic material surface with an oxide film.

[REFERENCE SIGNS LIST]
 10 Surface treatment apparatus
 11 Surface treatment bath
 12 Electrolyte solution
 13 Anode
 14 Cathode
 15 Material to be treated
 16 Direct-current power source
 17 Lead wire
 18 Lead wire
 20 Surface treatment apparatus
 21 Surface treatment bath
 22 Electrolyte solution
 23 Anode
 24 Cathode
 25 Material to be treated
 26 Direct-current power source
 27 Lead wire
 28 Lead wire

The invention claimed is:

1. A method for producing a surface-treated metallic material, comprising: immersing an anode and a cathode in an electrolyte solution, placing a metallic material used as a material to be treated above the surface of the electrolyte solution, and applying a voltage between the anode and the cathode to treat the metallic material surface, the voltage being equal to or higher than a voltage for causing a complete plasma state.

2. The method for producing a surface-treated metallic material according to claim 1, wherein the metallic material is electrically connected to the cathode.

3. The method for producing a surface-treated metallic material according to claim 2, wherein the metallic material is separated from the cathode.

4. The method for producing a surface-treated metallic material according to claim 2, wherein a voltage of 100 volts or more and 300 volts or less is applied between the anode and the cathode.

5. The method for producing a surface-treated metallic material according to claim 2, wherein the distance between the surface of the electrolyte solution and the metallic material is 2 mm or more and 30 mm or less.

6. The method for producing a surface-treated metallic material according to claim 2, wherein the metallic material is a cold-rolled steel sheet.

7. The method for producing a surface-treated metallic material according to claim 1, wherein the metallic material is separated from the cathode.

8. The method for producing a surface-treated metallic material according to claim 7, wherein a voltage of 100 volts or more and 300 volts or less is applied between the anode and the cathode.

9. The method for producing a surface-treated metallic material according to claim 7, wherein the distance between the surface of the electrolyte solution and the metallic material is 2 mm or more and 30 mm or less.

10. The method for producing a surface-treated metallic material according to claim 7, wherein the metallic material is a cold-rolled steel sheet.

11. The method for producing a surface-treated metallic material according to claim 1, wherein a voltage of 100 volts or more and 300 volts or less is applied between the anode and the cathode.

12. The method for producing a surface-treated metallic material according to claim 11, wherein the distance between the surface of the electrolyte solution and the metallic material is 2mm or more and 30 mm or less.

13. The method for producing a surface-treated metallic material according to claim 11, wherein the metallic material is a cold-rolled steel sheet.

14. The method for producing a surface-treated metallic material according to claim 1, wherein the distance between the surface of the electrolyte solution and the metallic material is 2 mm or more and 30 mm or less.

15. The method for producing a surface-treated metallic material according to claim 14, wherein the metallic material is a cold-rolled steel sheet.

16. The method for producing a surface-treated metallic material according to claim 1, wherein the metallic material is a cold-rolled steel sheet.

* * * * *